United States Patent
Jen et al.

(10) Patent No.: US 11,792,981 B2
(45) Date of Patent: Oct. 17, 2023

(54) TWO DIMENSIONAL STRUCTURE TO CONTROL FLASH OPERATION AND METHODS FOR FORMING THE SAME

(71) Applicant: Taiwan Semiconductor Manufacturing Company Limited, Hsinchu (TW)

(72) Inventors: Chi-Chung Jen, Kaohsiung (TW); Yu-Chu Lin, Tainan (TW); Y. C. Kuo, Hsinchu (TW); Wen-Chih Chiang, Hsinchu (TW); Keng-Ying Liao, Tainan (TW); Huai-Jen Tung, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/000,613

(22) Filed: Aug. 24, 2020

(65) Prior Publication Data
US 2022/0059556 A1    Feb. 24, 2022

(51) Int. Cl.
*H01L 29/423*    (2006.01)
*H10B 41/46*    (2023.01)
(Continued)

(52) U.S. Cl.
CPC ........ *H10B 41/46* (2023.02); *H01L 29/40114* (2019.08); *H01L 29/42336* (2013.01); *H10B 41/30* (2023.02); *H01L 29/513* (2013.01)

(58) Field of Classification Search
CPC . H01L 29/51; H01L 29/423; H01L 29/42336; H01L 29/513; H01L 29/40114; H01L 27/11539; H01L 27/11521; H01L 21/28; H01L 29/49; H01L 29/66; H01L 29/435; H01L 29/783; H01L 29/6659; H01L 29/7833; H01L 27/1104; H01L 27/11568; H01L 2924/13026; H01L 2924/13091
(Continued)

(56) References Cited

U.S. PATENT DOCUMENTS 5,923,063 A * 7/1999 Liu ..................... H01L 29/7885
257/314
6,127,226 A * 10/2000 Lin ................... H01L 27/11521
438/270
(Continued)

FOREIGN PATENT DOCUMENTS

TW    200405556 A    4/2004
TW    202022924 A    6/2020

OTHER PUBLICATIONS

Taiwan Patent and Trademark Office, Application No. 110105177 Office Action, dated Nov. 10, 2021, 6 pages.

*Primary Examiner* — Chuong A Luu
(74) *Attorney, Agent, or Firm* — The Marbury Law Group, PLLC

(57) ABSTRACT

A MOSFET device and method of making, the device including a floating gate layer formed within a trench in a substrate, a tunnel dielectric layer located on sidewalls and a bottom of the trench, a control gate dielectric layer located on a top surface of the floating gate layer, a control gate layer located on a top surface of the control gate dielectric layer and sidewall spacers located on sidewalls of the control gate dielectric layer and the control gate layer.

20 Claims, 17 Drawing Sheets

(51) Int. Cl.
*H01L 21/28* (2006.01)
*H10B 41/30* (2023.01)
*H01L 29/51* (2006.01)

(58) Field of Classification Search
USPC .......................................................... 257/316
See application file for complete search history.

(56) References Cited

U.S. PATENT DOCUMENTS

| | | | |
|---|---|---|---|
| 2002/0110984 A1* | 8/2002 | Liou | H01L 29/7883 |
| | | | 438/257 |
| 2002/0146884 A1* | 10/2002 | Kawata | H01L 27/105 |
| | | | 438/257 |
| 2002/0151136 A1* | 10/2002 | Lin | H01L 27/11556 |
| | | | 438/259 |
| 2003/0013250 A1* | 1/2003 | Koh | H01L 27/11521 |
| | | | 257/E27.103 |
| 2004/0077147 A1* | 4/2004 | Lin | H01L 27/11556 |
| | | | 438/259 |
| 2005/0169041 A1* | 8/2005 | Wang | H01L 29/42336 |
| | | | 257/E27.103 |
| 2005/0199914 A1* | 9/2005 | Chen | H01L 27/11556 |
| | | | 257/209 |
| 2010/0207180 A1* | 8/2010 | Lee | H01L 27/10802 |
| | | | 257/296 |
| 2012/0080748 A1* | 4/2012 | Hsieh | H01L 29/66734 |
| | | | 257/E21.409 |
| 2019/0304989 A1* | 10/2019 | Chao | H01L 21/823842 |

\* cited by examiner

TWO DIMENSIONAL STRUCTURE TO CONTROL FLASH OPERATION AND METHODS FOR FORMING THE SAME

BACKGROUND

Integrated circuit metal oxide semiconductor field effect transistor (MOSFET) memory devices, i.e. flash memory, typically include a memory region and a peripheral logic region. The memory region includes transistors, which have a floating gate layer and a tunnel dielectric layer located between the channel region and the top surface of the control gate layer. The transistors located in the peripheral logic region do not have a floating gate or a tunnel dielectric layer. Thus, the transistors in the memory region are typically taller than the transistors in the peripheral logic region. That is, the distance from the top surface of the substrate to the top surface of the control gate layer of the transistors in the memory region is larger than the distance from the top surface of the substrate to the top surface of the control gate layer in the peripheral logic region of the MOSFET device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
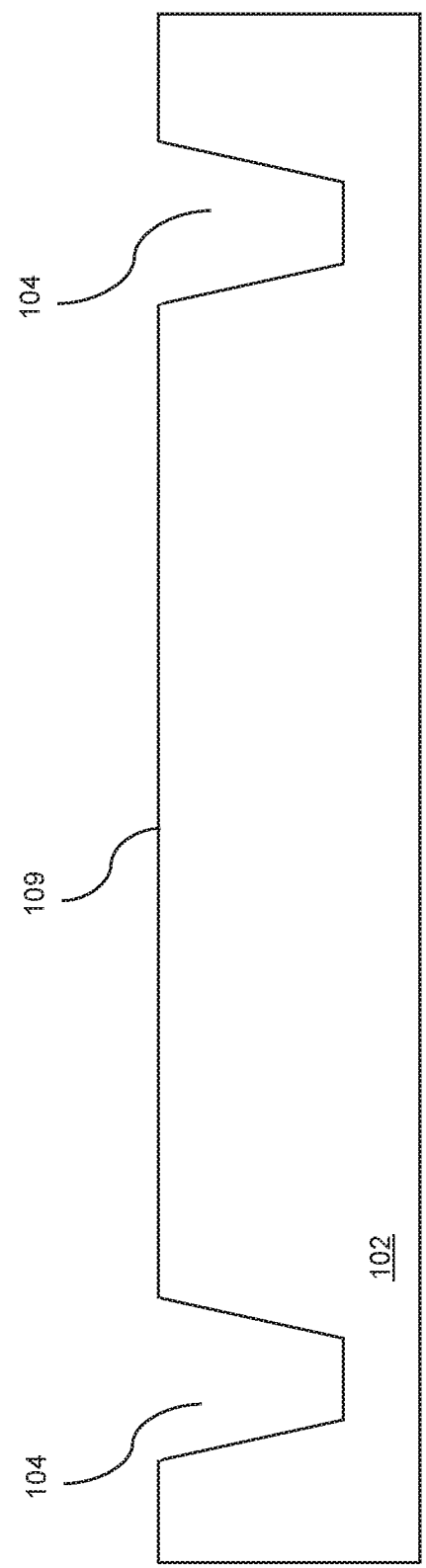
FIG. 1 is a vertical cross-sectional view illustrating a step of etching trenches in a substrate to form shallow trench isolation structures in the substrate in a method for fabricating a semiconductor device in accordance with various embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the structures and methods of the present disclosure can be used to form metal-oxide semiconductor field effect transistor (MOSFET) semiconductor devices, e.g. integrated circuit MOSFET devices, in which at least some of the MOSFETs have floating gates formed within the substrate upon which the MOSFET is formed. As discussed above, transistors formed in a memory region have a floating gate layer and a tunnel dielectric layer located between the channel region that may be formed between active regions (i.e., source and drain regions) and the top surface of the control gate layer. Typically, the channel regions is formed in the substrate while the tunnel dielectric layer and the floating gate layer are formed over the top surface of the substrate. A control gate dielectric layer is typically formed over the floating gate layer and a control gate layer formed over the control gate dielectric layer. In contrast, transistors formed in the peripheral logic region do not include a floating gate layer. The addition of the floating gate layer and the tunnel dielectric layer may substantially increase the height of the memory transistor relative to a logic transistor. That is, the logic region has devices with one polysilicon layer (i.e. the control gate layer) while the memory region has devices with two polysilicon layers (i.e., the floating gate layer and the control gate layer). As a result, the transistors formed in the memory region are typically taller than the transistors formed in the peripheral logic region.

The difference in height between transistors formed in the memory region and the transistors formed in the peripheral logic region may adversely impact the ability to utilize a single photolithographic processes over both regions because the focal distance of photolithographic process varies between regions. Specifically, the difference in topography between the memory region and the peripheral logic region results in these regions having different focal points which may adversely affect photolithography processes. For example, when one of the memory region or peripheral logic region is in focus, the other region (memory of peripheral logic region) may be out of focus, resulting in an under etched region. Such under etching may result in undesired residue sticking to the surface of the out of focus region (i.e., memory of peripheral logic region). Alternatively, one of the memory of peripheral logic regions may be in focus, the other region (memory of peripheral logic region) may be out of focus, resulting in the out of focus region being over etched. Over etching may result in peeling of a polysilicon layer, especially, the top most polysilicon layer.

In order to mitigate the height difference between transistors formed in the memory region that include a floating date layer and a tunnel dielectric layer, various embodiments disclosed herein form the floating gates and the tunnel dielectric layers of the transistors within the substrate. Consequently, the height of the transistors formed in the memory region with a floating gate layer and the tunnel dielectric layer may be approximately the same height as the transistors in the peripheral logic region that are formed without the floating gate and tunnel dielectric layers. In this manner, the focus of the lithographic radiation can be made essentially the same in the memory region and the peripheral logic region, thereby reducing or eliminating photolithographic damage that may have occurred due to different focal distances in the memory region and the peripheral logic regions.

Referring to FIG. 1, an exemplary structure according to an embodiment of the present disclosure is illustrated. The exemplary structure includes a substrate 102, which can be a semiconductor substrate such as a commercially available silicon substrate. Shallow trench isolation (STI) trenches 104 may be etched in substrate 102. To etch the STI trenches 104, a photoresist (not shown) may be deposited on a top surface 109 of the substrate 102 and patterned. Any suitable photoresist may be used, such as a positive or negative photoresist. Further, the substrate 102 may be etched with any suitable wet or dry etch or a combination of wet and dry etching. The substrate 102 may be made silicon, silicon on insulator (SOI), silicon on sapphire (SOS) or any other suitable material. The STI trenches 104 may have a depth in a range from 50 nm to 500 nm. For example, the STI trenches 104 may have a depth in a range of 75 nm to 400 nm, although greater or lesser depths are within the contemplated scope of disclosure.

Figure 2:
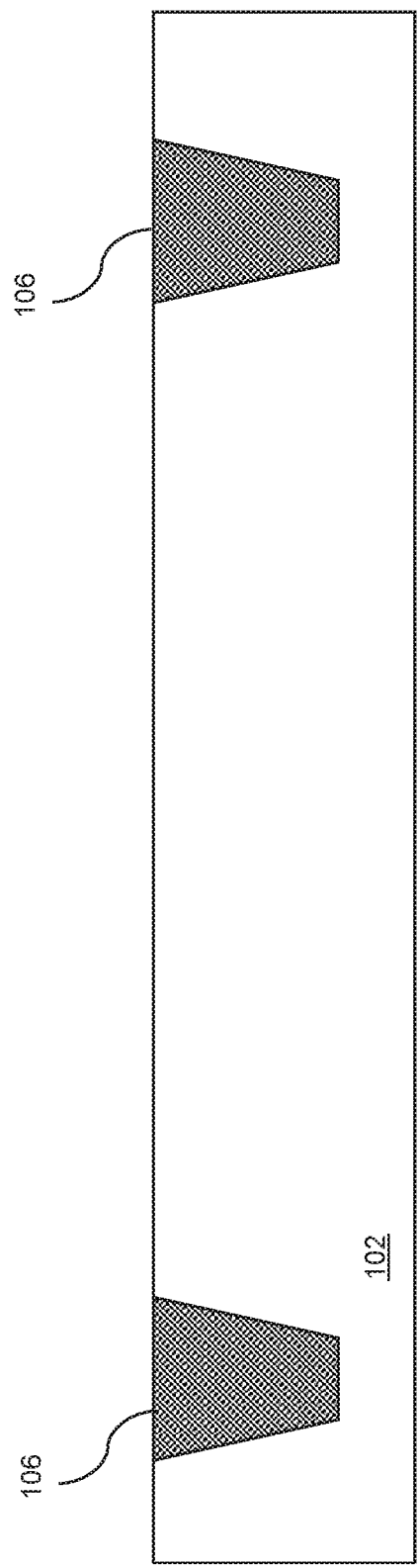
FIG. 2 is a vertical cross-sectional view illustrating a step of depositing an insulating material in the trenches in the substrate in a method for fabricating a semiconductor device in accordance with various embodiments of the disclosure.

Referring to FIG. 2, a STI dielectric material may be deposited into the STI trench 104 to form STI structures 106. The STI structures 106 provide electrical isolation between adjacent transistors. The STI structures 106 may be made of any suitable dielectric material, such as silicon oxide ($SiO_2$). The STI dielectric material may be deposited by chemical vapor deposition (CVD), plasma enhanced chemical vapor deposition (PECVD) or any other suitable deposition method.

Figure 3:
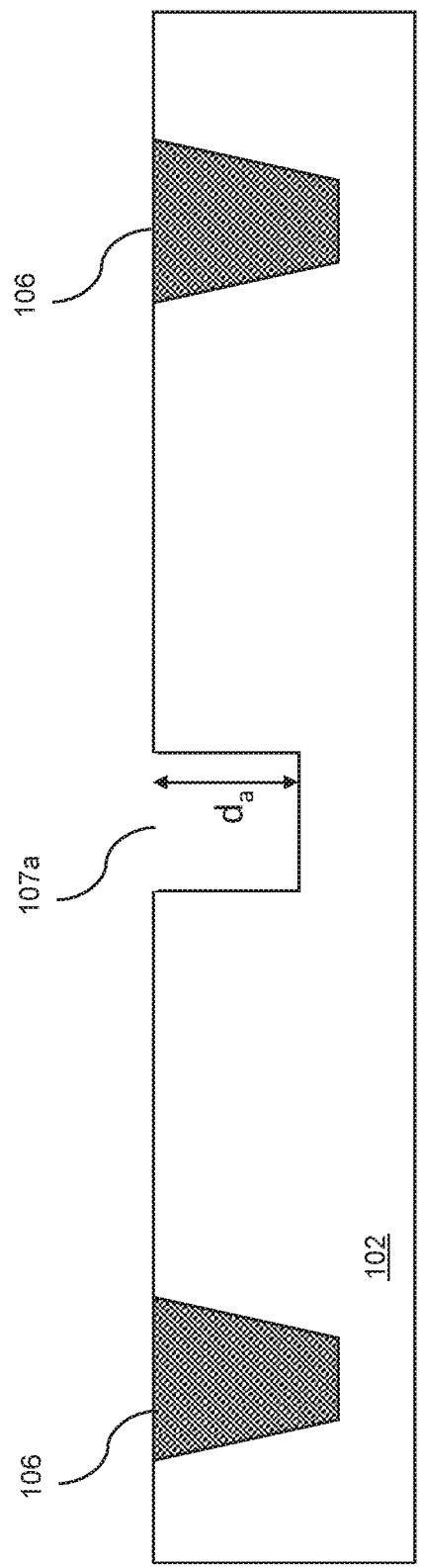
FIG. 3 is a vertical cross-sectional view illustrating a step of etching a memory trench in the substrate in a method for fabricating a semiconductor device in accordance with various embodiments of the disclosure.

Referring to FIG. 3, a first floating gate trench 107a may be formed in the substrate 102 between adjacent STI structures 106. The first floating gate trench 107a may be formed by first covering the substrate 102 and the STI structures 106 with a photoresist (not shown) and patterning the photoresist. The patterned photoresist then may be used as a mask to etch the substrate 102 to form the first floating gate trench 107a. Any suitable photoresist and etchants may be used. The photoresist and/or etchants may be the same as or different from the photoresist and/or etchants used to form the STI trenches 104. After forming the first floating gate trench 107a, the photoresist may be removed, such as by ashing, dissolving or grinding. Optionally, the photoresist layer may be left on the substrate 102 and removed after forming a first tunnel dielectric layer 108a and the first floating gate layer 110a (discussed in more detail below) such that excess tunnel dielectric layer material and floating gate material may be removed in a liftoff process. In various embodiments, the first floating gate trench 107a may have a depth $d_a$ in a range of 50 nm to 400 nm, such as 75 nm to 300 nm. Trenches having a smaller or greater depth may also be formed as discussed in greater detail below.

Figure 4:
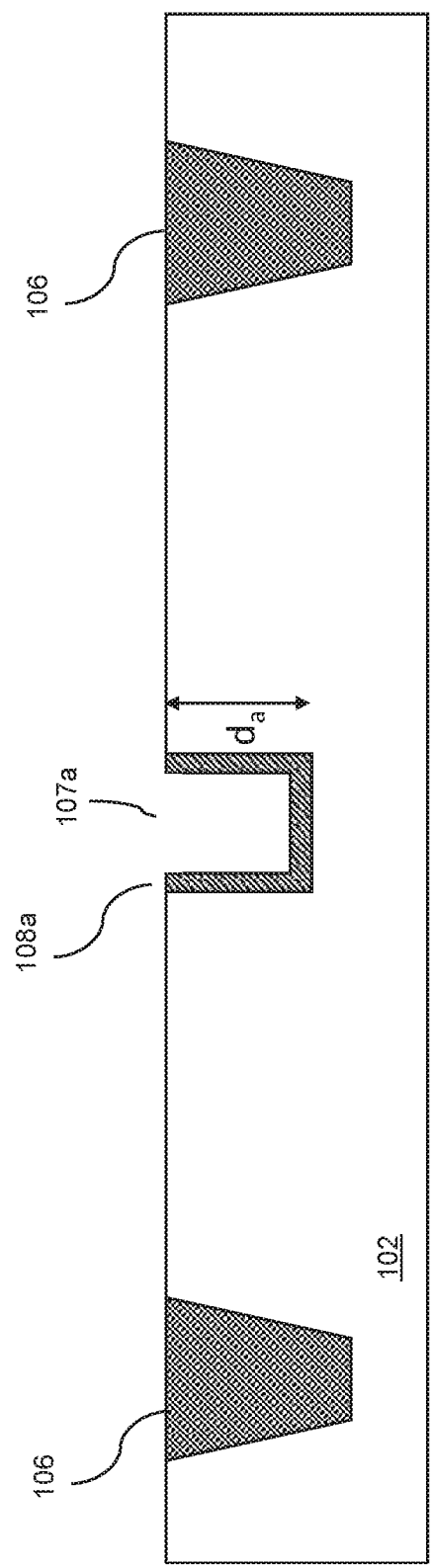
FIG. 4 is a vertical cross-sectional view illustrating a step of depositing a tunnel dielectric layer in the memory trench in the substrate in a method for fabricating a semiconductor device in accordance with various embodiments of the disclosure.

Referring to FIG. 4, a first tunnel dielectric layer 108a may be conformally deposited on the sidewalls of the first floating gate trench 107a. The first tunnel dielectric layer 108a may be made of $SiO_2$, $Si_3N_4$, $Al_2O_3$, $Y_2O_3$, $La_2O_3$, $Ta_2O_3$, $TiO_2$, $HfO_2$ or $ZrO_2$. Other suitable materials may be within the contemplated scope of disclosure. The first tunnel dielectric layer 108a may be deposited by CVD, PECVD, atomic layer deposition (ALD) or any other suitable method. The first tunnel dielectric layer 108a may have a thickness in the range of 1 nm to 15 nm, although greater or lesser thicknesses are within the contemplated scope of disclosure.

Figure 5:
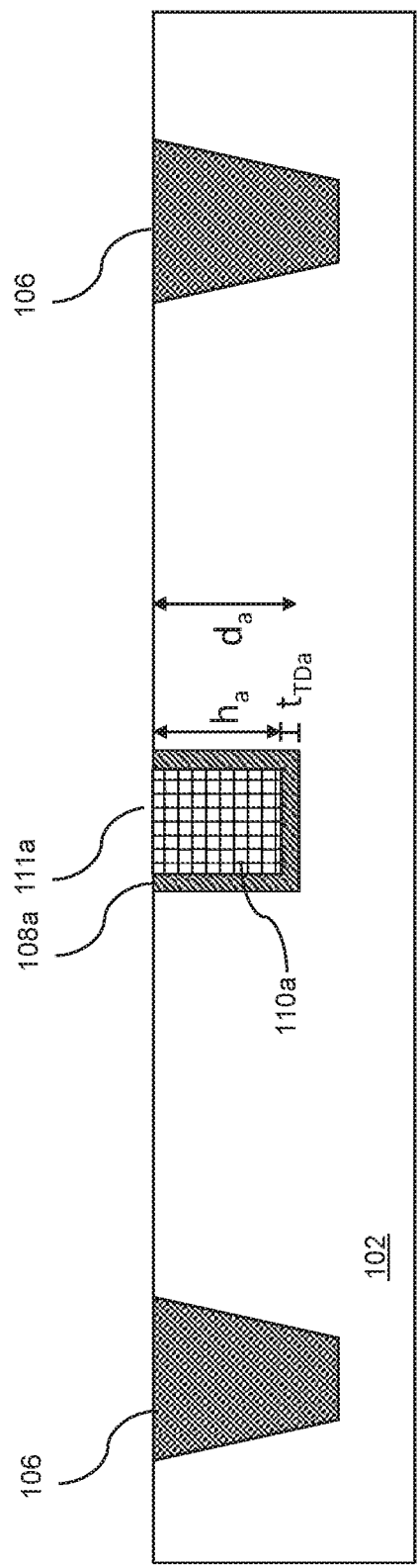
FIG. 5 is a vertical cross-sectional view illustrating a step of depositing a floating gate layer in the memory trench in a method for fabricating a semiconductor device in accordance with various embodiments of the disclosure.

Referring to FIG. 5, a first floating gate layer 110a may be formed in the first floating gate trench 107a. In an embodiment, the first floating gate trench 107a may be completely filled with the first tunnel dielectric layer 108a and the first floating gate layer 110a. Thus, the height $h_a$ of the first floating gate layer 110a and the thickness $t_{TDa}$ of the first tunnel dielectric layer 108a may be equal to the depth $d_a$ of the first floating gate trench 107a. The first floating gate layer 110a may comprise polysilicon or any other suitable material and may be deposited by any suitable method, such as CVD, PECVD or ALD. Optionally, a planarizing step may be performed to remove any excess floating gate layer material. In this manner, a top surface 111a of the first floating gate layer 110a may be made coplanar with the top surface of the substrate 102. Planarizing may be performed by chemical mechanical polishing or by any other suitable method.

Figure 6:
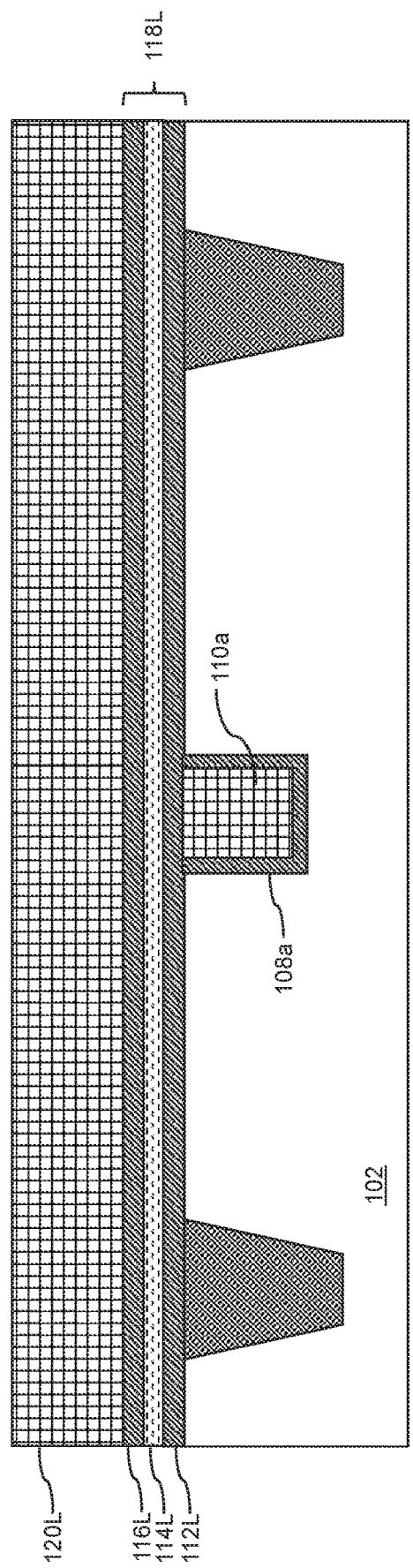
FIG. 6 is a vertical cross-sectional view illustrating a step of depositing a gate dielectric layer and a control gate layer over the substrate and the floating gate layer in a method for fabricating a semiconductor device in accordance with various embodiments of the disclosure.

Referring to FIG. 6, a continuous control gate dielectric layer 118L may be deposited over the substrate 102, first tunnel dielectric layer 108a and the first floating gate layer 110a as well as the STI structures 106. In an embodiment, the continuous control gate dielectric layer 118L may include a continuous first gate oxide layer 112L, a continuous nitride layer 114L over the continuous first gate oxide layer 112L and a continuous second gate oxide layer 116L over the continuous nitride layer 114L, thereby forming an oxide/nitride/oxide (ONO) sandwich layer. A continuous control gate layer 120L may then be deposited over the continuous second gate oxide layer 116L. The continuous control gate layer 120L may be made of polysilicon or any other suitable material. The continuous control gate dielectric layer 118L and the continuous control gate layer 120L may be deposited by any suitable method, such as CVD, PECVD and ALD.

Figure 7:
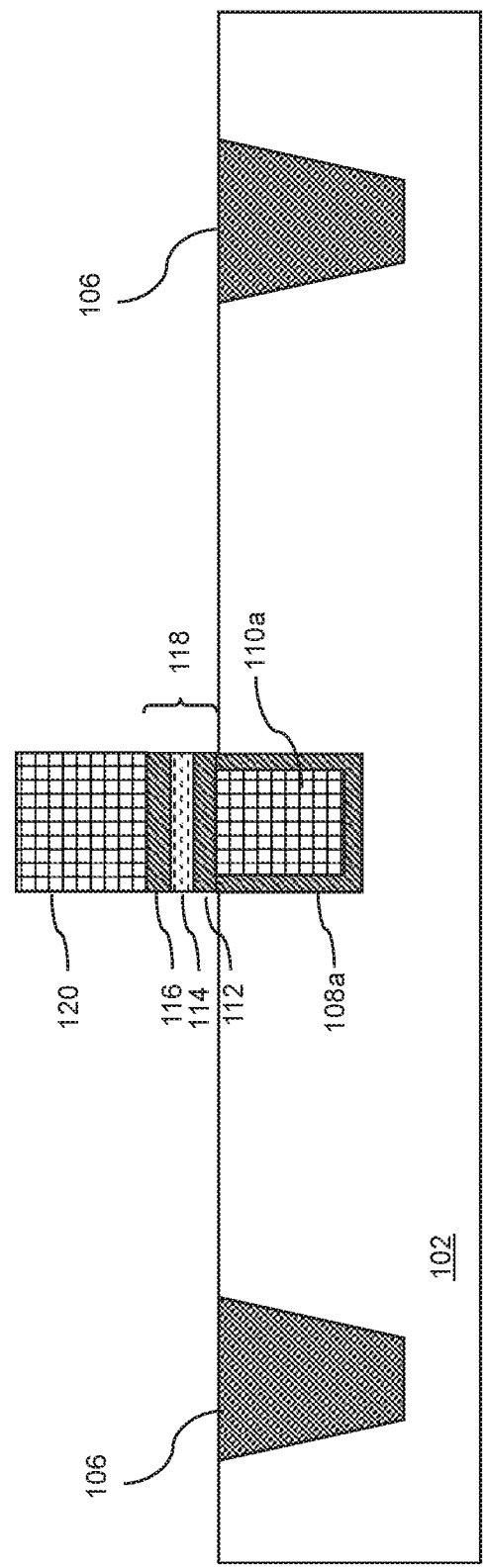
FIG. 7 is a vertical cross-sectional view illustrating a step of patterning the gate dielectric layer and the control gate layer in a method for fabricating a semiconductor device in accordance with some embodiments.

Referring to FIG. 7, the continuous control gate dielectric layer 118L and the continuous control gate layer 120L may be patterned. To pattern the continuous control gate dielectric layer 118L and the continuous control gate layer 120L, a photoresist (not shown) may be deposited on the top surface of the continuous control gate layer 120L and patterned. The continuous control gate dielectric layer 118L and the continuous control gate layer 120L may be patterned using the patterned photoresist as a mask. The result is a patterned control gate dielectric layer 118 and patterned control gate layer 120 both formed over the first floating gate layer 110a. In an embodiment, patterning of the continuous control gate dielectric layer 118L results in a patterned first gate oxide layer 112, a patterned nitride layer 114 over the patterned first gate oxide layer 112 and a patterned second gate oxide layer 116 over the patterned nitride layer 114.

Figure 8:
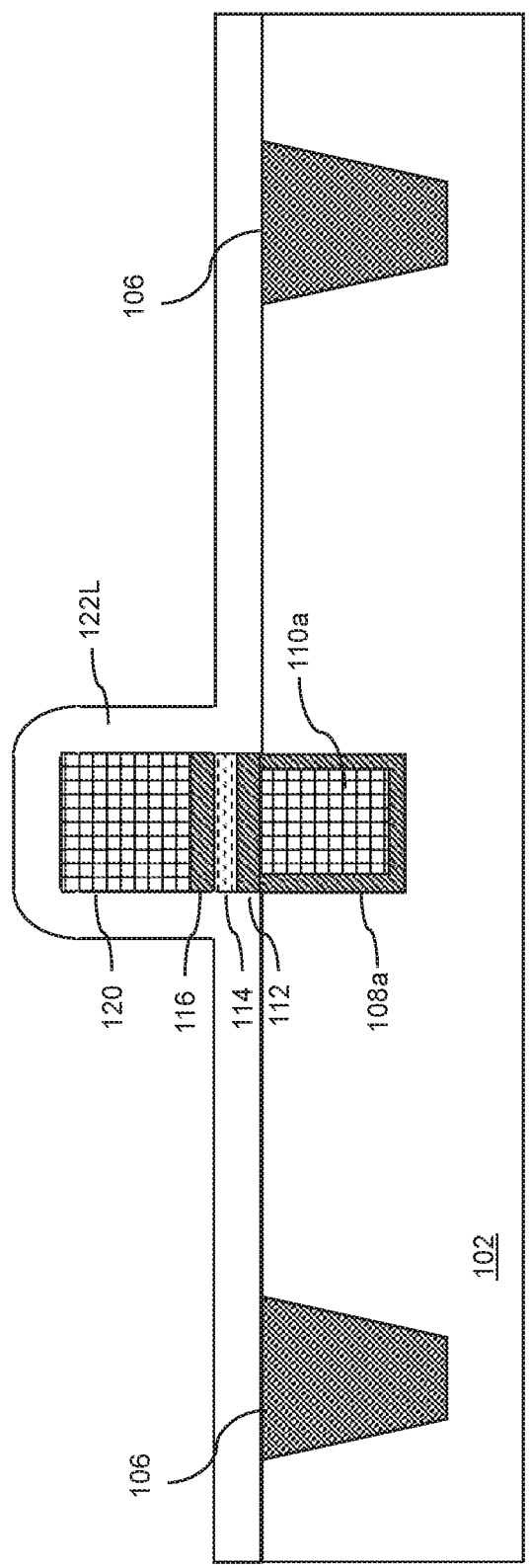
FIG. 8 is a vertical cross-sectional view illustrating a step of depositing a sidewall spacer dielectric layer over the substrate, the control gate dielectric layer and the control gate layer in a method for fabricating a semiconductor device in accordance with various embodiments of the disclosure.

Referring to FIG. 8, a continuous sidewall spacer layer 122L may be deposited over the surface of the substrate 102, the STI structures 106, the patterned control gate dielectric layer 118 and the patterned control gate layer 120. The continuous sidewall spacer layer 122L may be made of any suitable dielectric material, including but not limited to $SiO_2$, or $Si_3N_4$. Other suitable materials are within the contemplated scope of disclosure. The continuous sidewall spacer layer 122L may be deposited by any suitable method such as CVD, PECVD or ALD. A planarizing step may be performed to remove any excess continuous sidewall spacer layer 122L material deposited over the patterned control gate layer 120. Planarizing may be performed by chemical mechanical polishing or by any other suitable method.

Figure 9:
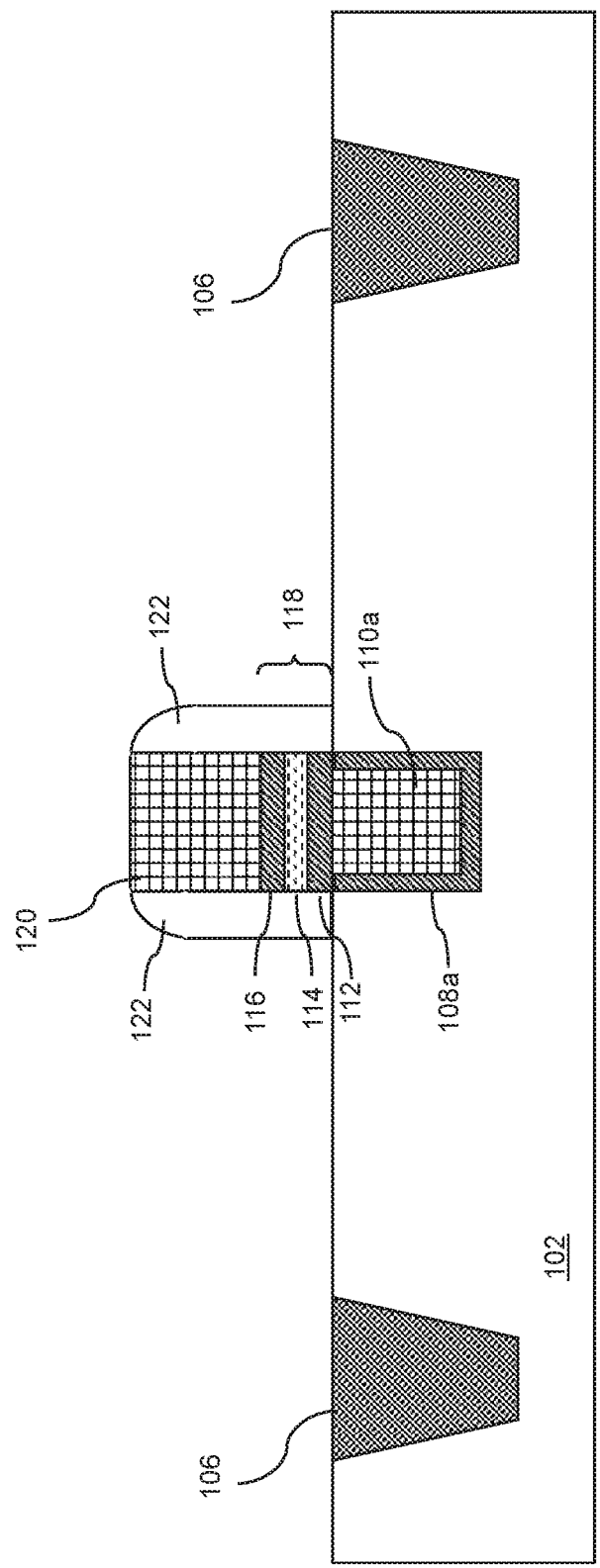
FIG. 9 is a vertical cross-sectional view illustrating a step of patterning the sidewall spacer dielectric layer in a method for fabricating a semiconductor device in accordance with various embodiments of the disclosure.

Referring to FIG. 9, the continuous sidewall spacer layer 122L may be patterned to form sidewall spacers 122 located on the sidewalls of the patterned control gate dielectric layer 118 and the patterned control gate layer 120. The continuous sidewall spacer layer 122L may be patterned with a photolithographic process. A photoresist layer (not shown) may be deposited over the continuous sidewall spacer layer 122L and patterned. The patterned photoresist may then be used as an etch mask to pattern the continuous sidewall spacer layer 122L to make the sidewall spacers 122. An etch process may be performed to remove the continuous sidewall spacer layer 122L covering the horizontal portions of the substrate and STI structures 106 such that dielectric spacers are formed on the sides of the patterned control gate dielectric layer 118 and the patterned control gate layer 120.

Figure 10:
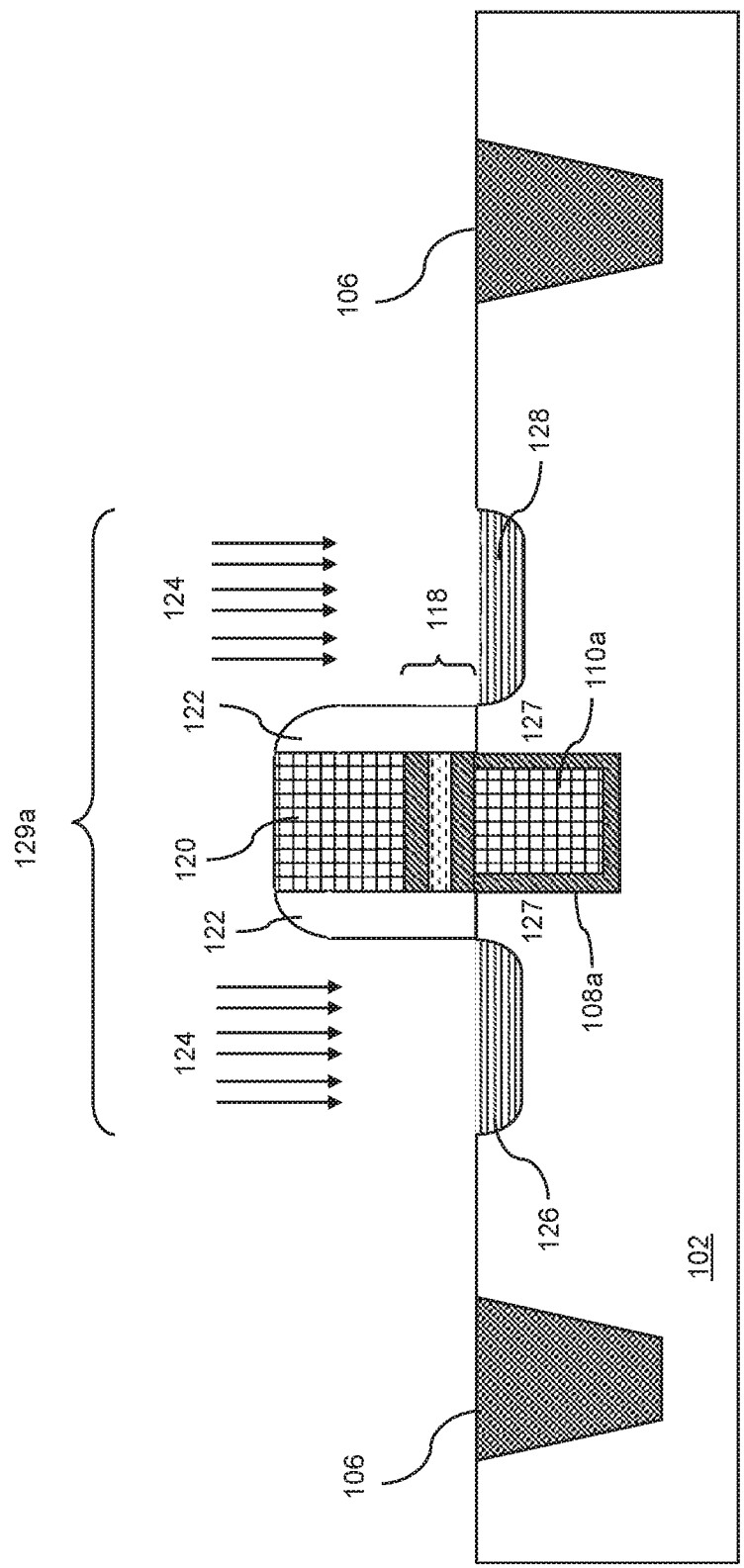
FIG. 10 is a vertical cross-sectional view illustrating a step of forming active regions in the substrate by ion implantation in a method for fabricating a semiconductor device in accordance with various embodiments of the disclosure.

Referring to FIG. 10, portions of the substrate 102 may be ion 124 implanted to form active regions 126, 128 (source and drain regions). The sidewall spacers 122 and the patterned control gate layer 120 may be used as a mask so that the active regions 126, 128 may be self-aligned with the patterned control gate layer 120. For example, the active regions 126, 128 may be doped either p-type or n-type as desired. Example n-type dopants include, but are not limited to, antimony, arsenic and phosphorous. Example p-type dopants include, but are not limited to boron, aluminum and gallium. The active regions 126, 128 may have an implanted ion concentration of $2 \times 10^{20}$ to $2 \times 10^{21}$. Greater or lesser doping concentrations may be used. Further, the active regions 126, 128 may have different dopant concentrations from each other. The active regions 126, 128, the channel region 127, the sidewall spacers 122 and the patterned control gate layer 120 over the patterned control gate dielectric layer 118 may form a first MOSFET device 129a. A channel region 127 may be formed between the active regions 126, 128 which typically is doped with the opposite dopant type than the active regions 126, 128. For example, if the active regions 126, 128 are p-type, then the channel is n-type. If the active regions 126, 128 are n-type, then the channel may be p-type. In various embodiments, the substrate may be doped prior to forming any other processing steps.

Figure 11:
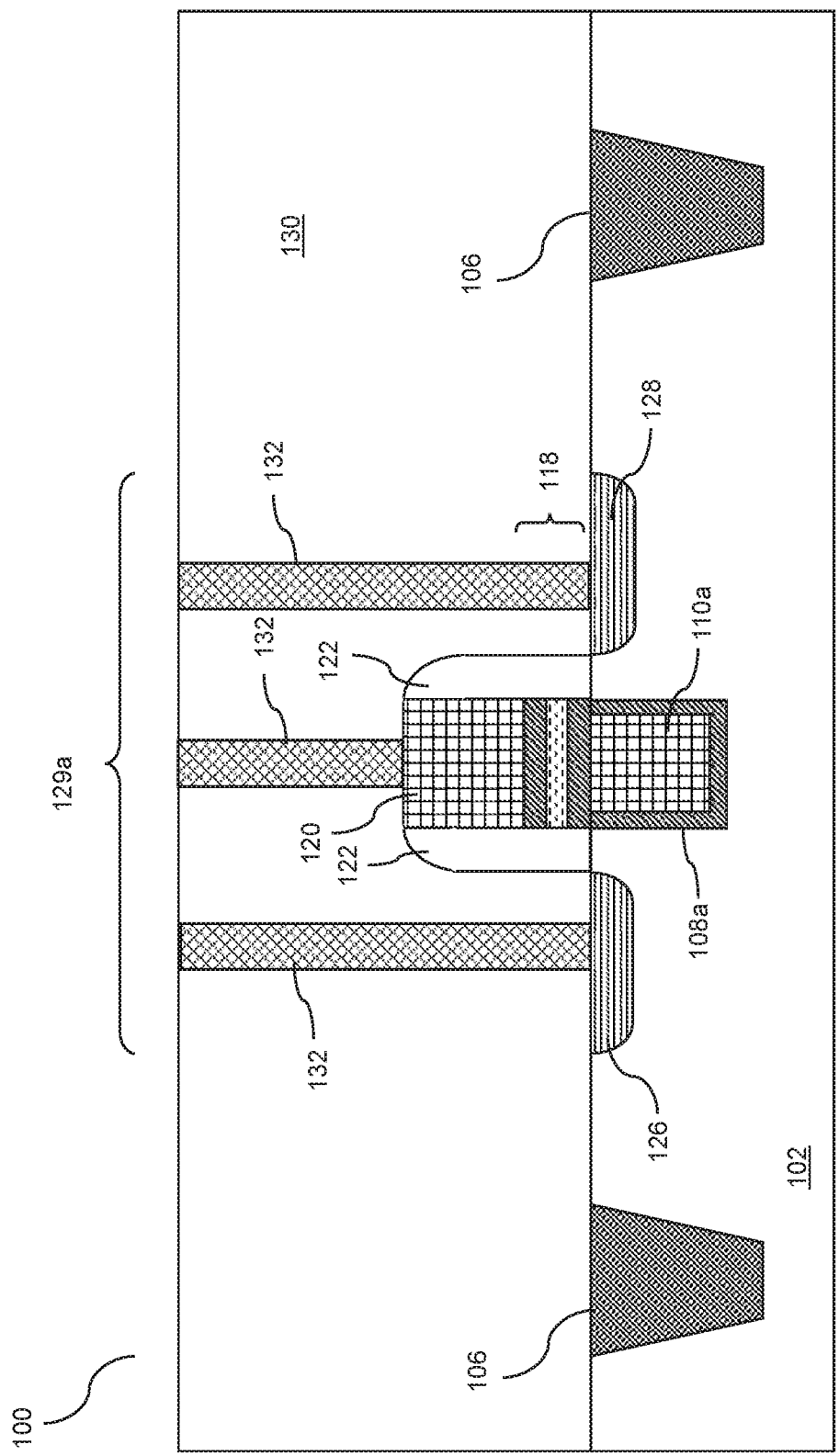
FIG. 11 is a vertical cross-sectional view illustrating a semiconductor device in accordance with various embodiments of the disclosure.

Referring to FIG. 11, an interconnect-level dielectric layer 130 may be deposited over the top surface of the substrate 102, the sidewall spacers 122 and the patterned control gate layer 120. Then, a photoresist layer (not shown) may be deposited and patterned to use as a mask to form via holes (not shown) in the interconnect-level dielectric layer 130. The via holes may be filled with metal, such as W, Cu, Co, Mo, Ru, other elemental metals, or an alloy or a combination thereof to form contact vias 132. Other suitable materials are within the contemplated scope of disclosure. In this manner, contact vias 132 coupled to the patterned control gate layer 120 and the active regions 126, 128 may be formed to complete the integrated circuit device 100. The result is an integrated circuit device 100 that includes first MOSFET devices 129a that include first floating gate layers 110a formed in the substrate 102. In an embodiment, the integrated circuit device 100 may be a dynamic random access memory (DRAM) or a static random access memory (SRAM).

Figure 12:
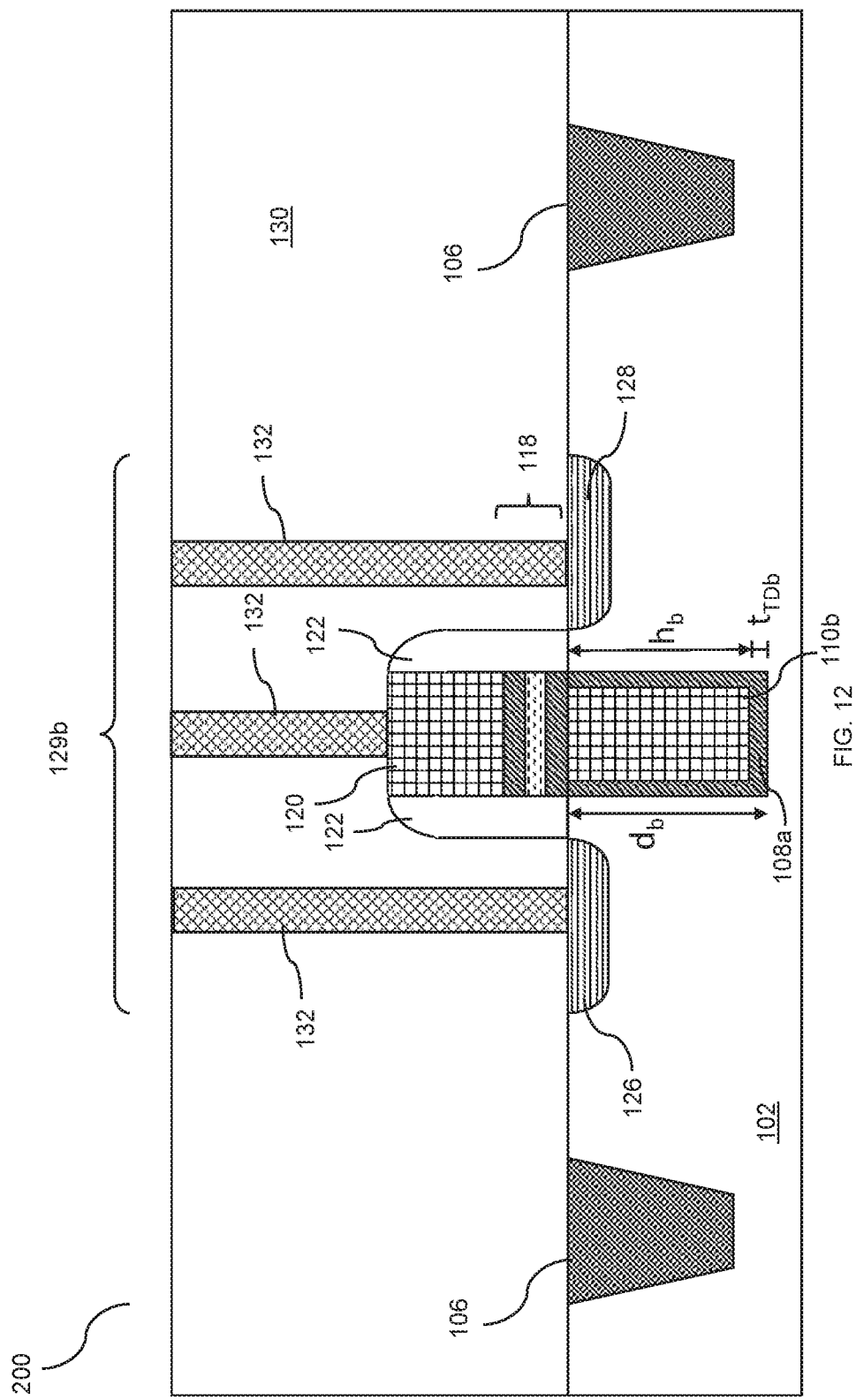
FIG. 12 is a vertical cross-sectional view illustrating another semiconductor device in accordance with various embodiments of the disclosure.

FIG. 12 illustrates another integrated circuit device 200 according to other embodiments of the disclosure. These embodiments are similar to the embodiment illustrated in FIG. 11. However, in these embodiments, a second floating gate trench 107b may be formed in the substrate 102 that is deeper than the first floating gate trench 107a discussed above. Specifically, the second floating gate trench 107b may a depth $d_b$ of 100 nm to 600 nm, such as 150 nm to 500 nm, although greater or lesser trench depths are within the contemplated scope of disclosure.

A second tunnel dielectric layer 108b may be conformally deposited on the sidewalls of the second floating gate trench 107b. The second tunnel dielectric layer 108b may have a thickness $t_{TDb}$ that is the same as or different than the thickness $t_{TDa}$ of the first tunnel dielectric layer 108a. The second tunnel dielectric layer 108b may be made of $SiO_2$, $Si_3N_4$, $Al_2O_3$, $Y_2O_3$, $La_2O_3$, $Ta_2O_3$, $TiO_2$, $HfO_2$ or $ZrO_2$. Other suitable materials may be within the contemplated scope of disclosure. The second tunnel dielectric layer 108b may be deposited by CVD, PECVD, atomic layer deposition (ALD) or any other suitable method. The second tunnel dielectric layer 108b may have a thickness in the range of 1 nm to 15 nm, although greater or lesser thicknesses are within the contemplated scope of disclosure.

A second floating gate layer 110b may be formed in the second floating gate trench 107b. In an embodiment, the second floating gate trench 107b may be completely filled with the second tunnel dielectric layer 108b and the second floating gate layer 110b. Thus, the height $h_b$ of the second floating gate layer 110b and the thickness of the second tunnel dielectric layer 108b may be equal to the depth $d_b$ of the second floating gate trench 107b. Because the height $h_b$ of the second floating gate layer 110b is larger than the height $h_a$ of the first floating gate layer 110a, the second floating gate layer 110b may have a larger volume that the first floating gate layer 110a for the same areal footprint. Because the second floating gate layer 110b may have a larger volume than the first floating gate layer 110a, the second floating gate layer 110b may hold more charge than the first floating gate layer 110a. Thus, the integrated circuit device 200 with the larger volume second floating gate layer 110b may be described as a higher capacity device. An integrated circuit device 100 with a smaller first floating gate layer 110a holds less charge than the integrated device 200 and can be discharged more quickly. Thus, the integrated circuit device 100 with the smaller first floating gate layer 110a can be described as a higher speed switching device.

The second floating gate layer 110b may comprise polysilicon or any other suitable material and may be deposited by any suitable method, such as CVD, PECVD or ALD. Optionally, a planarizing step may be performed to remove any excess floating gate layer material. In this manner, a top surface 111b of the second floating gate layer 110b may be made coplanar with the top surface of the substrate 102. Planarizing may be performed by chemical mechanical polishing or by any other suitable method.

In an embodiment, the patterned control gate dielectric layer 118 of the integrated circuit device 200 may be formed so that it is thicker than the patterned control gate dielectric layer 118 of the integrated circuit device 100. In an embodiment, the patterned control gate dielectric layer 118 of the integrated circuit device 200 as illustrated in FIG. 12 may comprises an ONO sandwich layer as discussed above with respect to FIGS. 6-11. The patterned first gate oxide layer 112 as illustrated in FIG. 12 may have a thickness that is 20-70% thicker than the patterned first gate oxide layer 112 in the integrated circuit device 100 as illustrated in FIGS. 6-11, although greater or lesser thicknesses are within the contemplated scope of disclosure. In an embodiment, the patterned first gate oxide layer 112 as illustrated in FIG. 12 may have a thickness that is 30-60% thicker than the patterned first gate oxide layer 112 in the integrated circuit device 100 as illustrated in FIGS. 6-11, although greater or lesser thicknesses are within the contemplated scope of disclosure. In an embodiment, the patterned first gate oxide layer 112 as illustrated in FIG. 12 may have a thickness that is 40-50% thicker than the patterned first gate oxide layer 112 in the integrated circuit device 100 as illustrated in FIGS. 6-11.

Figure 13:
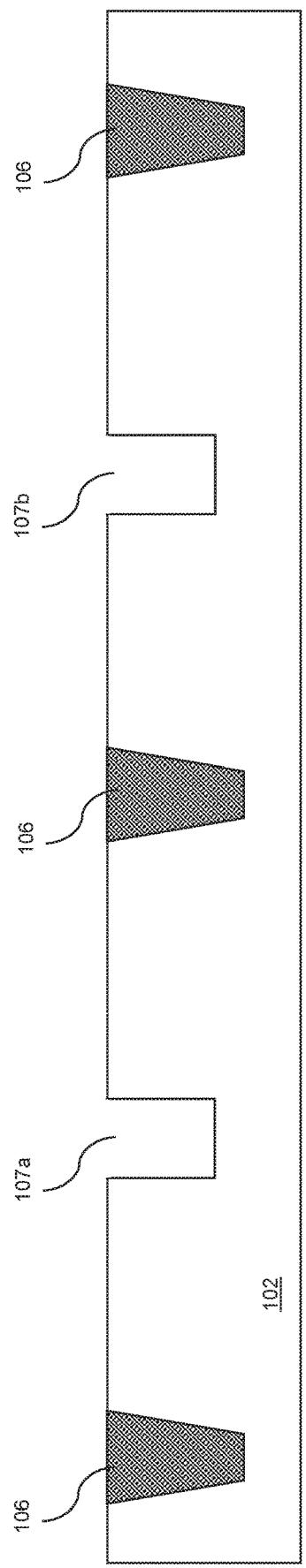
FIG. 13 is a vertical cross-sectional view illustrating a step of forming two memory trenches in another method for fabricating a semiconductor device in accordance with various embodiments of the disclosure.
Figure 14:
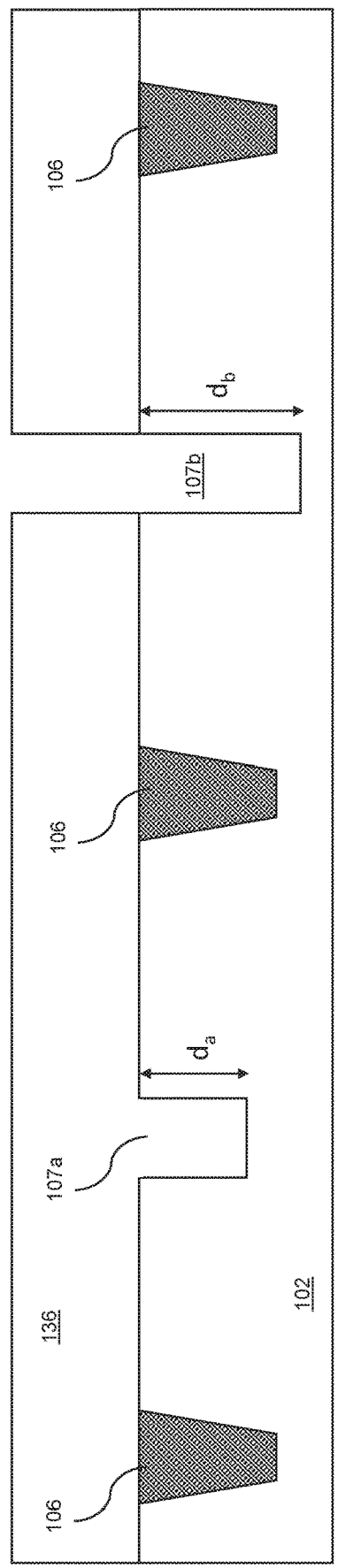
FIG. 14 is a vertical cross-sectional view illustrating a step of extending the depth of one of the memory trenches in the other method for fabricating a semiconductor device in accordance with various embodiments of the disclosure.
Figure 15:
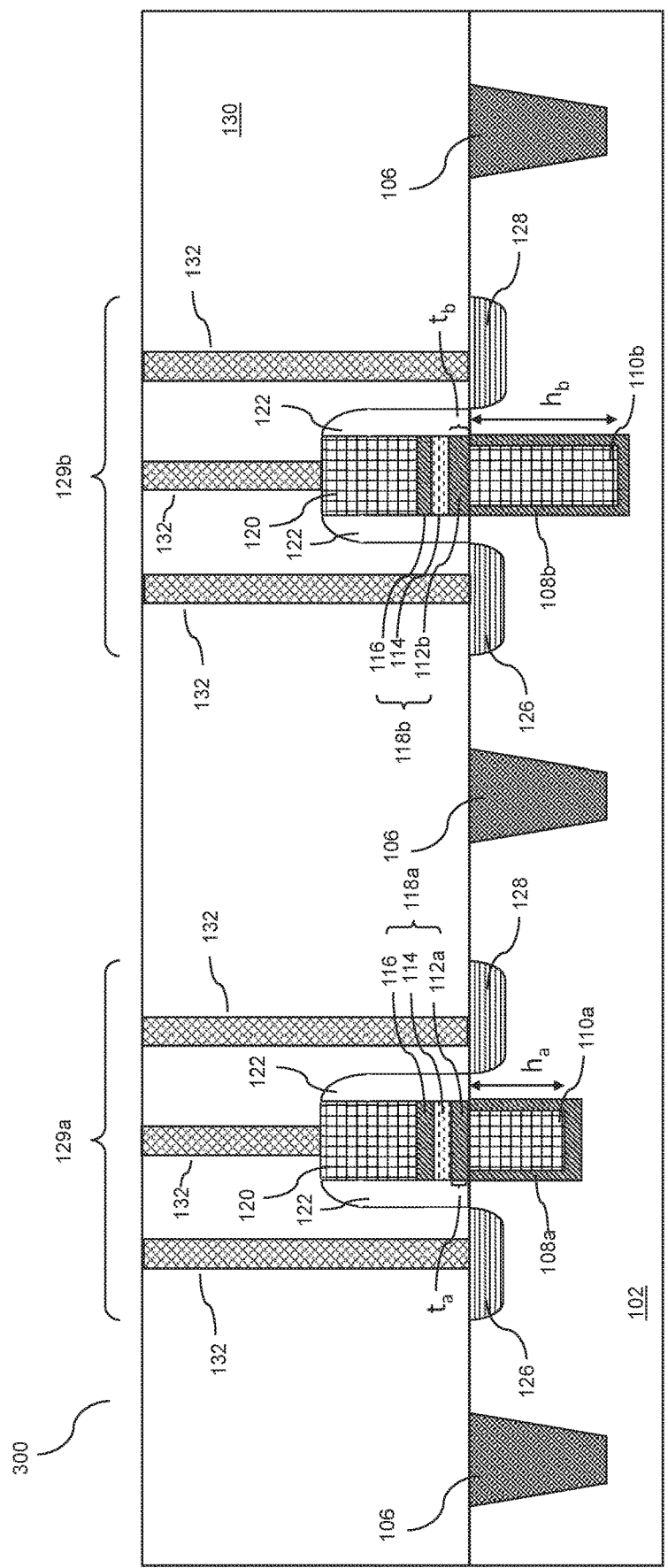
FIG. 15 is a vertical cross-sectional view illustrating another semiconductor device in accordance with various embodiments of the disclosure.

FIGS. 13-15 illustrate steps in a method of making integrated circuit device 300 according to another embodiment. Referring to FIG. 13, in a step similar to the step illustrated in FIG. 3, a first floating gate trench 107a and a second floating gate trench 107b may be formed in a substrate 102 with an STI structure 106 located between the first and second floating gate trenches 107a, 107b. In this step, both first and second floating gate trenches 107a, 107b have the same depth.

Referring to FIG. 14, a photoresist layer 136 may be deposited over the top surface 109 of the substrate 102. The photoresist layer 136 may fill the first and second floating gate trenches 107a, 107b. As illustrated in FIG. 14, the photoresist layer 136 may be patterned such that the photoresist layer 136 covers the first floating gate trench 107a and exposes the second floating gate trench 107b. The substrate 102 may then be further etched such that the depth of the second floating gate trench 107b in the substrate 102 is increased relative to the depth of the first floating gate trench 107a.

FIG. 15 illustrates an integrated circuit device 300 according to the present embodiment. The integrated circuit device 300 includes first MOSFET device 129a having a first floating gate layer 110a with a first height $h_a$ which can be described as higher speed and second transistor 129b having a second floating gate layer 110b with a second height $h_b$ which can be described as higher capacity. The first MOSFET device 129a includes a smaller first floating gate layer 110a due to the smaller height $h_a$ of the first floating gate layer 110a as compared to the second floating gate layer 110b of second height $h_b$ of the second transistor structure 129b.

The first and second patterned control gate dielectric layers 118a, 118b for the first and second transistor 129a, 129b may be formed by depositing continuous layers, such as a continuous first gate oxide layer 112L, continuous nitride layer 114L and continuous second gate oxide layer 116L spanning both the first and second transistor 129a, 129b and patterning as discussed above. In alternative embodiments, the patterned second gate oxide layer 112b of the second MOSFET device 129b may be thicker than the patterned first gate oxide layer 112a of the first MOSFET device 129a. In a method of forming the alternative embodiments, a continuous first gate oxide layer 112L having a first thickness may be deposited.

Processing continues as discussed above. Specifically, a photoresist may be deposited over the continuous first gate oxide layer 112L and patterned such that the continuous first gate oxide layer 112L in regions where the first transistor 129a are to be formed are masked and the continuous first gate oxide layer 112L in regions where the second transistor 129b are to be formed are exposed. Additional oxide material may be deposited such that the thickness of the exposed first gate oxide layer 112L increases. In this manner, the thickness of the continuous first gate oxide layer 112L for the second transistor 129b may be made thicker than the thickness of the continuous first gate oxide layer 112L for the first transistor 129a. The photoresist may then be removed and processing continued as discussed above. After patterning the continuous first gate oxide layer 112L, the continuous nitride layer 114L, the continuous second gate oxide layer 116L and the continuous control gate layer 120L, the result is an integrated circuit device 300 with a first transistor 129a having a patterned first gate oxide layer 112a with a thickness $t_a$ and second transistor 129b having a patterned second gate oxide layer 112b with a thickness $t_b$. The thickness $t_b$ being thicker than the thickness $t_a$. In an embodiment, the thickness $t_b$ of the second patterned gate oxide layer 112b may have a thickness that is 20-70% thicker than the thickness $t_a$ of the patterned first gate oxide layer 112a. In an embodiment, the thickness $t_b$ of the second patterned gate oxide layer 112b may have a thickness that is 30-60% thicker than the thickness $t_a$ of the patterned first gate oxide layer 112a. In an embodiment, the thickness $t_b$ of the second patterned gate oxide layer 112b may have a thickness that is 40-50% thicker than the thickness $t_a$ of the patterned first gate oxide layer 112a.

Figure 16:
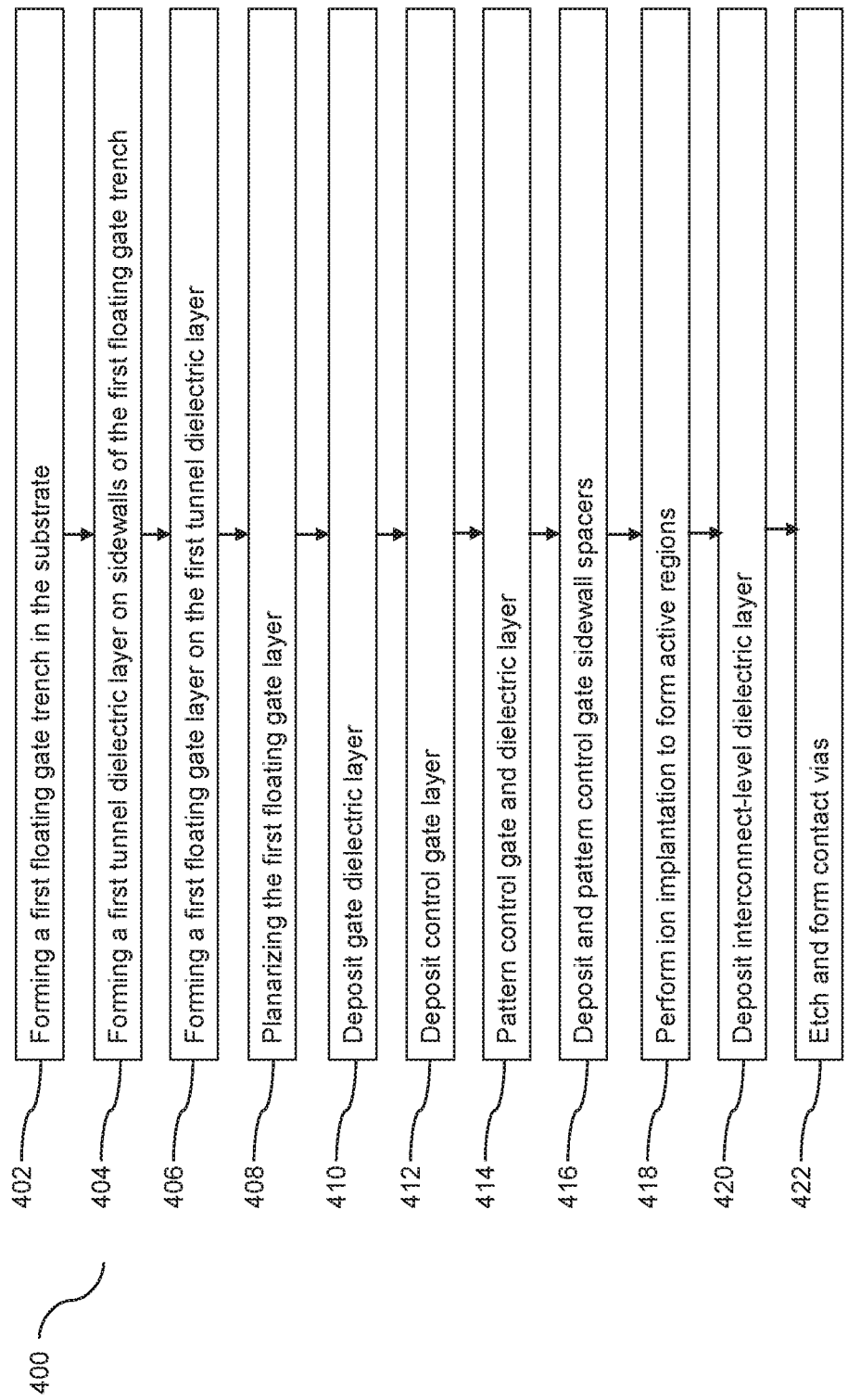
FIG. 16 is a flowchart illustrating a method of making a semiconductor device in accordance with various embodiments of the disclosure.

FIG. 16 is a flowchart illustrating general method 400 of making an integrated circuit device 100, 200 having a first floating gate layer 110a formed in a substrate 102. Referring to step 402, a first floating gate trench 107a may be formed in substrate 102 by patterning a photoresist layer over the substrate 102 and performing a subsequent etch process. As discussed above, the etch process may include any suitable wet or dry etch or a combination of wet and dry etching. Referring to step 404, a first tunnel dielectric layer 108a may be formed on sidewalls of the first floating gate trench 107a. The first tunnel dielectric layer 108a may be deposited by CVD, PECVD, atomic layer deposition (ALD) or any other suitable method. Referring to step 406, a first floating gate layer 110a may be formed on the first tunnel dielectric layer 108a. The first floating gate layer 110a may be deposited by any suitable method, such as CVD, PECVD or ALD. Referring to step 408, the first floating gate layer 110a may be planarized. The planarizing step 408 may be performed to remove any excess floating gate layer material. Planarizing may be performed by chemical mechanical polishing or by any other suitable method. To complete the integrated circuit device 100, 200, a continuous control gate dielectric layer 118L may be deposited over the substrate 102, the first tunnel dielectric layer 108a and the first floating gate layer 110a in step 410. The continuous control gate dielectric layer 118L may comprise a continuous first gate oxide layer 112L, a continuous nitride layer 114L and a continuous second gate oxide layer 116L. Next, in step 412, a continuous control gate layer 120L may be deposited over the continuous control gate dielectric layer 118L. In step 414, the continuous control gate dielectric layer 118L and the continuous control gate layer 120L may be patterned to form patterned control gate dielectric and patterned control gate layers 120. In step 416, a continuous sidewall spacer layer 122L may be deposited and patterned to form sidewall spacers 122 on the patterned control gate dielectric and patterned control gate layers 118, 120. The sidewall spacers 122 may be used as a mask in an ion implantation, step 418, to form active regions 126, 128 (source/drain regions) and complete the first MOSFET device 129a. Next, in step 420, an interconnect-level dielectric layer 130 may be deposited and contact vias to the active regions 126,128 and the patterned control gate layer 132 may be formed in step 422.

Figure 17:
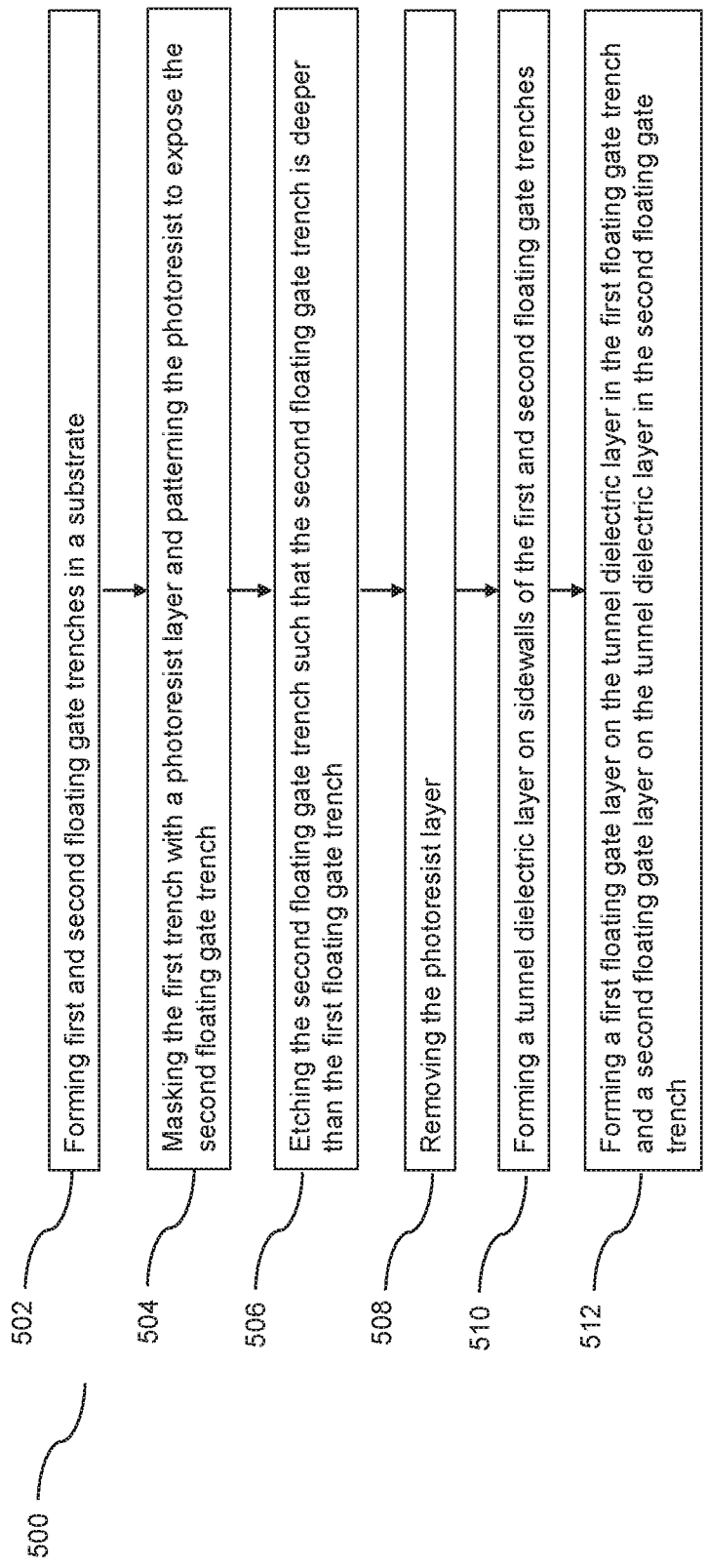
FIG. 17 is a flowchart illustrating another method of making a semiconductor device in accordance with various embodiments of the disclosure.

FIG. 17 is a flowchart illustrating a general method 500 of making an integrated circuit device 300 having higher speed and higher capacity first transistor 129a, 129b with first floating gate layers 110a embedded in a substrate 102. Referring to step 502, first and second floating gate trenches 107a, 107b may be etched in a substrate 102. Referring to step 504, the first floating gate trench 107a may be masked with a photoresist layer 136 and patterning the photoresist layer 136 to expose the second floating gate trench 107b. Referring to step 506, the second floating gate trench 107b may be etched such that the second floating gate trench 107b may be deeper than the first floating gate trench 107a. Referring to step 508, the photoresist layer 136 may be removed. Referring to step 510, a first tunnel dielectric layer 108a may be formed on sidewalls of the first and second floating gate trenches 107a, 107b. Referring to step 512, first floating gate layer 110a may be formed on the first tunnel dielectric layer 108a in the first floating gate trench 107a and a second floating gate layer 110b may be formed on the second tunnel dielectric layer 108b in the second floating gate trench 107b. After the formation of the floating gate layer on the tunnel dielectric layer as in step 512, the operations of steps 408-422 may be performed to complete the first and second MOSFET devices 129a and 129b.

Various embodiments of the present disclosure may provide a flash memory transistor with a first floating gate layer 110a buried within the substrate 102. By burying the first floating gate layer 110a within the substrate 102, the topography of the transistor formed in a memory region may be the same as the transistors formed in a peripheral logic region. By leveling the topography between transistors formed in a memory region with the transistors formed in a peripheral logic region, peeling defects due to defocus resulting from non-uniform heights between transistors in the memory region and transistors in the peripheral logic region may be mitigated. The uniform height allows for a uniform focal distance in subsequent photolithography operations. Conventional stacked polysilicon flash structures utilized i-line block process and poly guard rings to fix flash damage defect. The structures formed in the various embodiments disclosed herein may skip i-line block processes, thus improving efficiency and cost in fabrication. In addition, without the need for a poly guard ring, the resulting chip size may be reduced.

Referring to all drawings and according to various embodiments of the present disclosure, a MOSFET device including a first floating gate layer 110a formed within a first floating gate trench 107a in a substrate 102, a first tunnel dielectric layer 108a, 108b formed on sidewalls and a bottom of the first floating gate trench 107a, a patterned control gate dielectric layer 118 formed over on a top surface of the first floating gate layer 110a, a patterned control gate layer 120 located on a top surface of the control gate dielectric layer patterned and sidewall spacers 122 located on sidewalls of the patterned control gate dielectric layer 118 and the patterned control gate layer 120.

According to another embodiment of the present disclosure, an integrated circuit metal oxide semiconductor field effect transistor (MOSFET) device 100, 200, 300 may be provided on a substrate 102 including a plurality of MOSFET devices 129a or 129b in which at least one of the MOSFET devices 129a or 129b comprises a first floating gate layer 110a formed within a substrate 102.

Another embodiment is drawn to a method of making a MOSFET device 129a or 129b including etching a first floating gate trench 107a in the substrate 102, forming a first tunnel dielectric layer 108a, 108b on sidewalls of the first floating gate trench 107a, 107b, forming a first floating gate layer 110a in the first floating gate trench 107a, 107b on the first tunnel dielectric layer 108a, 108b, and planarizing the first floating gate layer 110a, 110b.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising a first field effect transistor and a second field effect transistor, wherein the first field effect transistor comprises:

a floating gate formed within a floating gate trench in a substrate comprising a semiconductor material, the floating gate having a first height;

a tunnel dielectric layer formed on sidewalls and a bottom of the floating gate trench and contacting a channel region at the bottom of the floating gate trench;

a control gate dielectric layer formed over a top surface of the floating gate;

a control gate formed over a top surface of the control gate dielectric layer;

a source region and a drain region located within an upper portion of the substrate and laterally spaced from, and not directly contacting, the tunnel dielectric layer or the control gate dielectric layer; and a sidewall spacer comprising a dielectric material, contacting an entirety of each sidewall of the control gate dielectric layer, and contacting at least a lower portion of each sidewall the control gate, wherein an entirety of an interface between the floating gate and the control gate dielectric layer is located within a horizontal plane including a top surface of the substrate which is a surface of the semiconductor material of the substrate, and wherein the second field effect transistor comprises an additional floating gate formed within an additional floating gate trench in the substrate, the additional floating gate having a second height that is different from the first height.

2. The semiconductor device of claim 1, wherein the top surface of the floating gate is coplanar with the top surface of the substrate.

3. The semiconductor device of claim 1, further comprising source and drain regions in the substrate and laterally spaced from, and not in direct contact with, the floating gate and the control gate.

4. The semiconductor device of claim 3, further comprising:
an interconnect-level dielectric layer covering the substrate; and
contact vias in the interconnect-level dielectric layer electrically coupled to the source region, the drain region and the control gate.

5. The semiconductor of claim 1, wherein the source region and the drain region comprise top surfaces that are coplanar with the top surface of the substrate.

6. The semiconductor device of claim 1, wherein:
the sidewall spacer contacts an entirety of a first surface segment of the substrate that continuously extends from a periphery of a top surface of the source region to a periphery of a first outer sidewall of the tunnel dielectric layer; and
the sidewall spacer contacts an entirety of a second surface segment of the substrate that continuously extends from a periphery of a top surface of the drain region to a periphery of a second outer sidewall of the tunnel dielectric layer.

7. The semiconductor device of claim 6, wherein:
the substrate comprises a semiconductor material;
an entirety of the first surface segment of the substrate comprises a surface segment of the semiconductor material; and
an entirety of the second surface segment of the substrate comprises another surface segment of the semiconductor material.

8. The semiconductor device of claim 1, wherein:
the tunnel dielectric layer is located entirely below a horizontal plane including the top surface of the substrate;
an entirety of a bottom surface of the control gate dielectric layer is located within the horizontal plane including the top surface of the substrate; and
the control gate dielectric layer has a uniform thickness throughout.

9. The semiconductor device of claim 1, wherein:
the first field effect transistor comprises a patterned gate oxide layer located on a top surface of the floating gate; and
the second field effect transistor comprises an additional patterned gate oxide layer located on a top surface of the additional floating gate and having a greater thickness than the gate oxide layer.

10. An integrated circuit metal oxide semiconductor field effect transistor (MOSFET) device on a substrate comprising a semiconductor material, the MOSFET device comprising:
a plurality of MOSFET devices,
wherein at least one of the plurality of MOSFET devices comprises:
a floating gate formed in a floating gate trench formed within in the substrate and located within a tunnel dielectric layer contacting a channel region at a bottom surface of the floating gate trench;
a control gate dielectric layer located on the floating gate;
a control gate located on the control gate dielectric layer;
a source region and a drain region located within an upper portion of the substrate and laterally spaced from, and not directly contacting, the tunnel dielectric layer or the control gate dielectric layer; and
a sidewall spacer comprising a dielectric material, contacting an entirety of each sidewall of the control gate dielectric layer, and contacting at least a lower portion of each sidewall the control gate,
wherein an entirety of an interface between the floating gate and the control gate dielectric layer is located within a horizontal plane including a top surface of the substrate which is a surface of the semiconductor material of the substrate,
wherein the plurality of MOSFET devices comprise:
a first transistor structure comprising a first floating gate formed within a first floating gate trench in a substrate, the first floating gate having a first height; and
a second transistor structure comprising a second floating gate formed within a second floating gate trench in the substrate, the second floating gate having a second height, and
wherein the second height is different from the first height.

11. The integrated circuit MOSFET device of claim 10, further comprising a first patterned gate oxide layer on a top surface of the first floating gate and a second patterned gate oxide layer on a top surface of the second floating gate, wherein the second gate oxide layer is thicker than the first gate oxide layer.

12. The integrated circuit MOSFET device of claim 10, wherein a top surface of the floating gate is coplanar with the top surface of the substrate, and wherein the tunnel dielectric layer comprises a top surface located within a horizontal plane including the top surface of the floating gate.

13. The integrated circuit MOSFET device of claim 12, wherein the least one of the plurality of MOSFET devices comprises source and drain regions located in the substrate and laterally spaced from, and not in direct contact with, the floating gate and the control gate.

14. A semiconductor device comprising:
a first metal oxide semiconductor field effect transistor (MOSFET) device, comprising:
   a first floating gate formed a first floating gate trench in a substrate comprising a semiconductor material and having a first floating gate height and located within a first tunnel dielectric layer contacting a first channel region at a bottom of the first floating gate trench;
   a first control gate dielectric layer located on the first floating gate;
   a first control gate located on the first control gate dielectric layer;
   a first source region and a first drain region located within an upper portion of the substrate and laterally spaced from, and not directly contacting, the first tunnel dielectric layer or the first control gate dielectric layer; and
   a first sidewall spacer comprising a dielectric material, contacting an entirety of each sidewall of the first control gate dielectric layer, and contacting at least a lower portion of each sidewall the first control gate, wherein an entirety of an interface between the first floating gate and the first control gate dielectric layer is located within a horizontal plane including a top surface of the substrate which is a surface of the semiconductor material of the substrate; and
a second MOSFET device, comprising:
   a second floating gate formed in the substrate and having a second floating gate height that is greater than the first floating gate height; and
   a second control gate formed on the second floating gate.

15. The semiconductor device of claim 14, wherein the first control gate has a first control gate height and the second control gate has a second control gate height that is substantially the same as the first control gate height.

16. The semiconductor device of claim 14, wherein first MOSFET device comprises a logic device and the second MOSFET device comprises a memory device.

17. The semiconductor device of claim 14, further comprising a second tunnel dielectric layer formed in a second floating gate trench in the substrate, the second floating gate being formed on the second tunnel dielectric layer.

18. The semiconductor device of claim 14, wherein an upper surface of the first floating gate is substantially coplanar with a surface of the substrate, and an upper surface of the second floating gate is substantially coplanar with the surface of the substrate.

19. The semiconductor device of claim 18, further comprising a second control gate dielectric layer formed on the upper surface of the second floating gate, the second control gate being formed on the second control gate dielectric layer.

20. The semiconductor device of claim 14, further comprising:
   a second control gate dielectric layer located between the second floating gate and the second control gate; and
   a second sidewall spacer comprising the dielectric material, contacting an entirety of each sidewall of the second control gate dielectric layer, and contacting at least a lower portion of each sidewall the second control gate.

* * * * *